United States Patent [19]
Parris et al.

[11] Patent Number: 5,671,392
[45] Date of Patent: Sep. 23, 1997

[54] MEMORY DEVICE CIRCUIT AND METHOD FOR CONCURRENTLY ADDRESSING COLUMNS OF MULTIPLE BANKS OF MULTI-BANK MEMORY ARRAY

[75] Inventors: Michael Parris; H. Kent Stalnaker, both of Colorado Springs, Colo.

[73] Assignees: United Memories, Inc., Colorado Springs, Colo.; Nippon Steel Semiconductor Corporation, Chiba, Japan

[21] Appl. No.: 419,909

[22] Filed: Apr. 11, 1995

[51] Int. Cl.$^6$ ............................................. G06F 12/00
[52] U.S. Cl. .......................... 395/475; 395/446; 395/477; 365/222; 365/200
[58] Field of Search .................. 364/DIG. 1; 395/446, 395/475, 477; 365/222, 200

[56] References Cited

U.S. PATENT DOCUMENTS

| | | | |
|---|---|---|---|
| 4,598,388 | 7/1986 | Anderson | 365/200 |
| 4,787,067 | 11/1988 | Takemae et al. | 365/222 |
| 5,408,677 | 4/1995 | Nogi | 395/800 |

*Primary Examiner*—Tod R. Swann
*Assistant Examiner*—James Peikari
*Attorney, Agent, or Firm*—William J. Kubida; Holland & Hart LLP

[57] ABSTRACT

A circuit and method for a memory device, such as a synchronous dynamic random access memory (SDRAM) having at least two memory banks. Columns of at least two memory banks are concurrently addressable to permit data to be written to, or read from, the at least two memory banks concurrently. By writing data concurrently to more than one memory bank, testing of the memory of the memory device can be effectuated in a reduced period of time. Data can also be written or read from a single bank in a multi-bank RAM without requiring that a particular bank be specified during a read/write command.

19 Claims, 3 Drawing Sheets

MEMORY DEVICE CIRCUIT AND METHOD FOR CONCURRENTLY ADDRESSING COLUMNS OF MULTIPLE BANKS OF MULTI-BANK MEMORY ARRAY

BACKGROUND OF THE INVENTION

The present invention relates generally to memory devices having multi-bank memory arrays, such as synchronous, dynamic random access memories (SDRAMs). More particularly, the present invention relates to a circuit and method which enables concurrent addressing of columns of memory cells of more than one bank of the multi-bank memory array.

Digital memory elements form essential portions of many different types of digital circuits. The digital memory devices store digital data which may be later accessed during operation of the digital circuits. Digital memory devices, for example, form essential portions of conventional computers. The computers typically include high storage capacity, memory devices which permit the storage of large amounts of digital data. During operation of the computer, the data stored in the memory devices is accessed and, typically, data generated during operation of the computer may be written to, and stored in, the memory devices.

A random access memory device is a type of digital memory device which includes memory cells for storing bits of digital data therein. Any one of the memory cells can be addressed and accessed independently of any other of the memory cells.

Random access memory devices include both read only memory (ROM) and read/write memory (RAM). Both ROM and RAM include static-load, synchronous, and asynchronous types of memory devices. RAMs further include static memory structures and dynamic memory structures. Static memory structures use some form of latched storage, while dynamic memory structures use some form of dynamic storage of charge on a capacitor.

Dynamic RAMs (DRAMs) and synchronous dynamic RAMs (SDRAMs) are types of dynamic structures and have achieved wide commercial usage in many varied types of digital devices. Usage of SDRAMs is becoming particularly popular as data stored in the memory cells of an SDRAM can be accessed within very short time periods. The memory cells of a memory array of an SDRAM are typically divided into banks of memory cells and SDRAM includes circuitry to permit operation of the SDRAM in a "burst mode" in which the memory cells of the SDRAM are accessed at much quicker rates than access rates at which the memory cells of a conventional, asynchronous DRAM can be accessed.

SDRAMs, as well as other types of memory devices, are tested subsequent to their manufacture to ensure that the memory cells operate properly. During the testing period, data of known values is written to the memory cells of the banks of the memory array. Data is applied with varied addressing sequences, typically to all of the memory cells of the memory array.

As the storage capacities of SDRAMs, as well as other types of memory devices, increases, increased amounts of time are required to write data to all of the memory cells of the banks of the memory array. Such increased amounts of time reduces the throughput of memory devices in a testing process.

SDRAMs are constructed to comply with standards and communication protocols promulgated by the Joint Electronic Device Engineering Council (JEDEC). The JEDEC-promulgated standards and communication protocols set forth the signal protocol of signals which cause addressing of the memory cells of the SDRAM. For instance, address select signals are defined. The address select signals, when applied to the SDRAM, cause addressing of the memory cells of the SDRAM.

In a two-bank SDRAM, the value of the most significant bit of the address select signals is determinative of which of the banks of the memory banks is addressed. The next-most significant bit during read/write commands is an auto precharge flag. And, the remaining bits include column address bits. For example, in a four megabit SDRAM, address select signals are applied to the SDRAM on nine address lines, $A_9$-$A_0$. $A_9$, the most significant bit, determines which of the memory banks of the memory array is addressed. Address line $A_8$ is a precharge flag. And, address lines $A_7$-$A_0$ include column address bits.

When testing the SDRAM, a series of address select signals are applied to the memory, the memory cells of the memory device are addressed responsive to the values of the address select signals, and data is written to the addressed memory cells. The data written to the memory cells is often written serially to the memory cells.

Typically, software algorithms are executed by a processor device to generate the address select signals on the address select lines. Because the memory cells are addressed responsive to values of the address select signals generated on all of the address select lines applied to the SDRAM but for the next-most significant bit thereof, the software algorithms used to generate the address select signals when testing the SDRAM cannot merely generate address select signals which increment in single bit increments to access all of the memory cells of the SDRAM. Because the address select signals generated on the address select lines cannot merely be incremented in the single bit increments, a simple, bit incrementor algorithm, generic to all sizes of SDRAMs, cannot be utilized. Rather, a more complex algorithm is required.

A means by which data can be more simply and quickly written to the memory cells of an SDRAM, or other memory device, would therefore be advantageous.

It is with respect to these considerations and other background information relative to memory devices that the significant improvements of the present invention have evolved.

SUMMARY OF THE INVENTION

The present invention advantageously provides a circuit, and an associated method, which permits columns of more than one memory bank of an SDRAM, or other memory device having memory banks, to be addressed concurrently. When the columns of the memory banks are addressed, data can be at least written concurrently to more than one memory bank.

During testing of a memory device incorporating the circuit and method of the present invention, columns of memory cells of more than one memory bank can be concurrently addressed, and data can be concurrently written to the memory cells of the memory banks. Therefore, data can be written to the memory device in a reduced period of time.

Also, when selecting the memory cells of the memory banks which are to be addressed during a testing procedure, address select signals generated on address select lines need only be incremented to permit addressing of the memory cells of the banks of the memory array of the memory device. Only a very simple, and easily implementable, algorithm is needed to generate address select signals which increment sequentially in value.

In accordance with the present invention, therefore, a circuit, and an associated method, for enabling concurrent addressing of columns of memory cells of at least two memory banks of a multi-bank memory array of a memory device is disclosed. A multi-bank addressing mode signal is applied to the memory device. A determination is made as to which memory banks of the multi-bank memory array are addressable. Column address select signals are generated responsive to application of the multi-bank addressing mode signal applied to the memory device to select addressing of a column of each memory bank determined to be addressable. Memory cells located in the columns of the memory banks selected by the column address signals are then addressed.

Once the memory cells are addressed, data can be concurrently written to, or concurrently read from, memory cells located in more than one memory bank.

A more complete appreciation of the present invention and the scope thereof can be obtained from the accompanying drawings which are briefly summarized below, the following detailed description of the presently preferred embodiments of the invention, and the appended claims.

BRIEF DESCRIPTION OF THE DRAWINGS

FIG. 4 is a functional block diagram illustrating a memory device similar to the memory device shown in FIG. 1, but further including comparator circuitry which compares data values of data read concurrently from more than one memory bank of the memory device.

DETAILED DESCRIPTION

Figure 1:
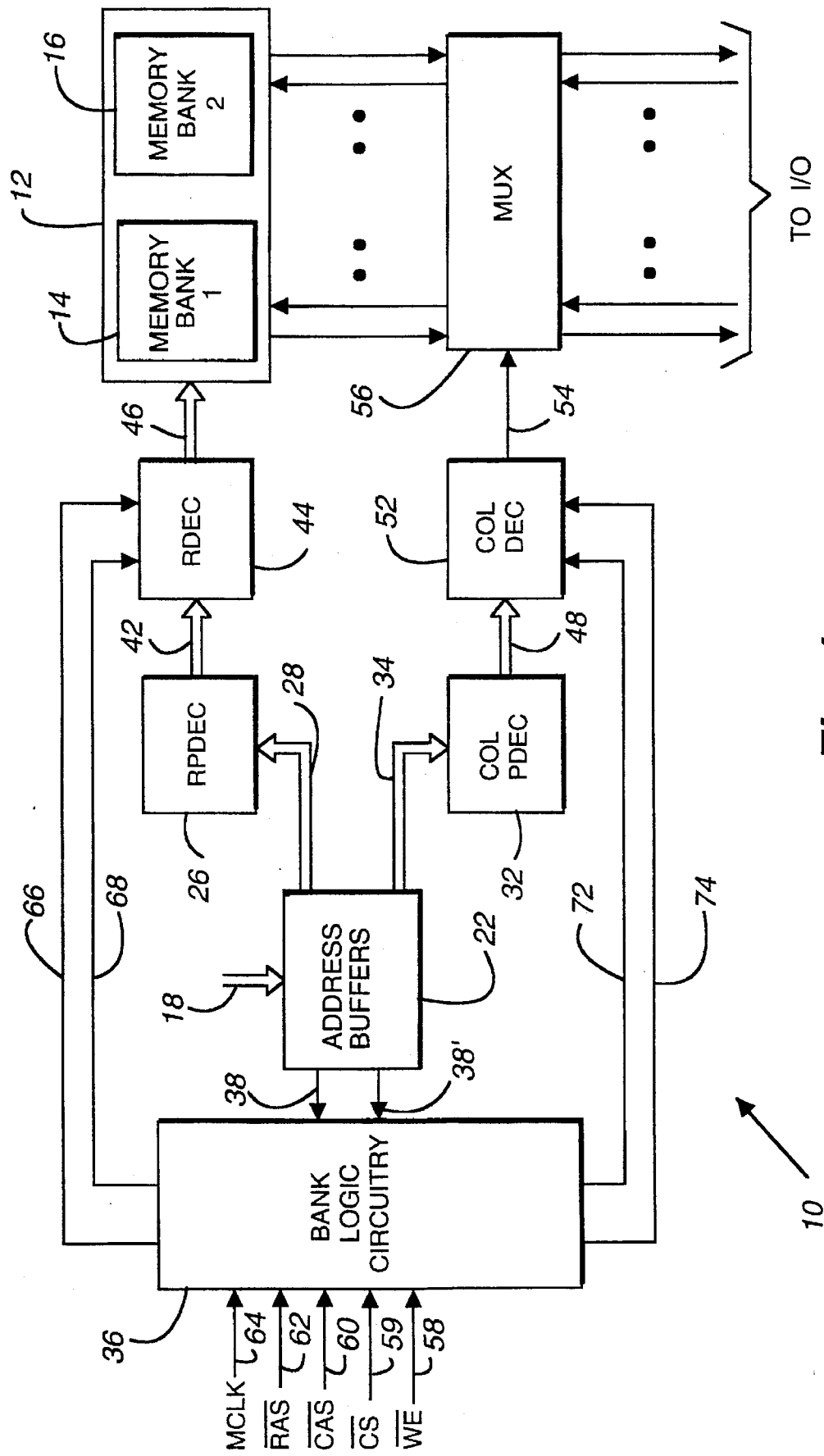
FIG. 1 is a functional block diagram illustrating a memory device including circuitry for enabling concurrent addressing of memory cells of at least two memory banks of a memory array.

FIG. 1 illustrates a memory device, shown generally at 10, of an embodiment of the present invention. The memory device 10 is a synchronous, dynamic random access memory (SDRAM). The memory device 10 includes a plurality of memory cells positioned in rows and columns to form a memory array 12. The memory array 12 is further configurable into memory banks, in conventional manner. The memory array 12 is configured into two banks 14 and 16 of memory cells. The memory banks 14 and 16 are separately addressable.

The memory cells of the banks 14 and 16 of the memory array 12 are addressed by addressing circuitry which addresses rows and columns of memory cells of the memory array 12.

The addressing circuitry receives address select signals on the address select lines 18, here address select lines $A_0$–$A_9$. The address select signals are applied to address buffers 22. As described previously, the most significant bit of the address select signals generated on the line 18 defines the memory bank, here memory bank 14 or 16, the next-most significant column address bit defines an auto precharge function, and the remaining bits of the address select signal as generated on the lines 18 address rows and columns of memory cells of the memory banks 14 and 16.

The address buffers 22 are operative to place the values of the address select signals applied thereto into forms which may be utilized by the elements of the memory device 10 and to latch the values of the address select signals.

The address buffers 22 are coupled to row predecoders 26 by way of lines 28. The address buffers 22 are also coupled to the column predecoders 32 by way of the lines 34. And, an address buffer of the address buffers 22 is coupled to bank logic circuitry 36 by way of lines 38 and 38'.

The row predecoders 26 are operative to generate signals on lines 42 responsive to the values of the signals generated on lines 28 and applied to the row predecoders 26.

The lines 42 are coupled to row decoders 44 which generate signals on selected word lines 46 which are coupled to rows of memory cells of the memory array 12.

The column predecoders 32 generate signals on selected ones of lines 48 which are coupled to column decoders 52. The column decoders generate signals on lines 54 which are applied to column multiplexor 56, operable in conventional manner. The multiplexor 56 is operable in conventional manner to route addressed data to and from the memory cells by way of sense amplifiers and write buffers (not shown) of the memory array 12. The multiplexor 56 is further coupled to conventional input and output circuitry to permit interfacing of the device 10 with other circuits.

The bank logic circuitry 36, in addition to receiving address select signals LA<9> and LAB<9> on the lines 38 and 38', is further coupled to receive input signals generated upon the lines 58, 59, 60, 62, and 64. That is to say, the bank logic circuitry receives latched values of the most significant bit of the address select signals and, its inverse, on lines 38 and 38'. The signals applied to the bank logic circuitry 36 on the lines 58, 59, 60, 62, 64 are signals defined by the aforementioned JEDEC standards. More particularly, a write enable, $\overline{WE}$, signal is generated on the line 58, a chip select, $\overline{CS}$, signal is generated on the line 59, a column address select, $\overline{CAS}$, signal is generated on the line 60, a row address select, $\overline{RAS}$, signal is generated on the line 62, and a clock signal, MCLK, is generated on the line 64.

Responsive to the signals applied to the bank logic circuitry 36, the bank logic circuitry 36 generates signals on lines 66, 68, 72, and 74. Bank active signals BA<0> and BA<1> are generated on lines 66 and 68 indicating times in which the memory banks 14 and 16, respectively, are determined to be addressable. The lines 66 and 68 are applied to the row decoders 44, and the values the signals of applied thereto on the lines 66 and 68 are indicative, of times in which the memory banks 14 and 16, respectively, are addressable.

The bank logic circuitry 36 is further operable to generate signals on lines 72 and 74 which are coupled to the column decoder circuitry 52. Signals may be generated by the bank logic circuitry 36 on either lines 72 or 74 or both lines 72 and 74. When a signal is generated on the line 72, the column decoder circuitry 52 generates signals on the line 54 to permit addressing of a column of the first memory bank 14. When a signal is generated on the line 74, the column decoder 52 generates a signal on line 54 to permit addressing of a column of the second memory bank 16. When signals are generated on both of the lines 72 and 74, the column decoder circuitry 52 generates signals on the line 54 to permit addressing of a column of memory cells of both the first memory bank 14 and the second memory bank 16.

Figure 2:
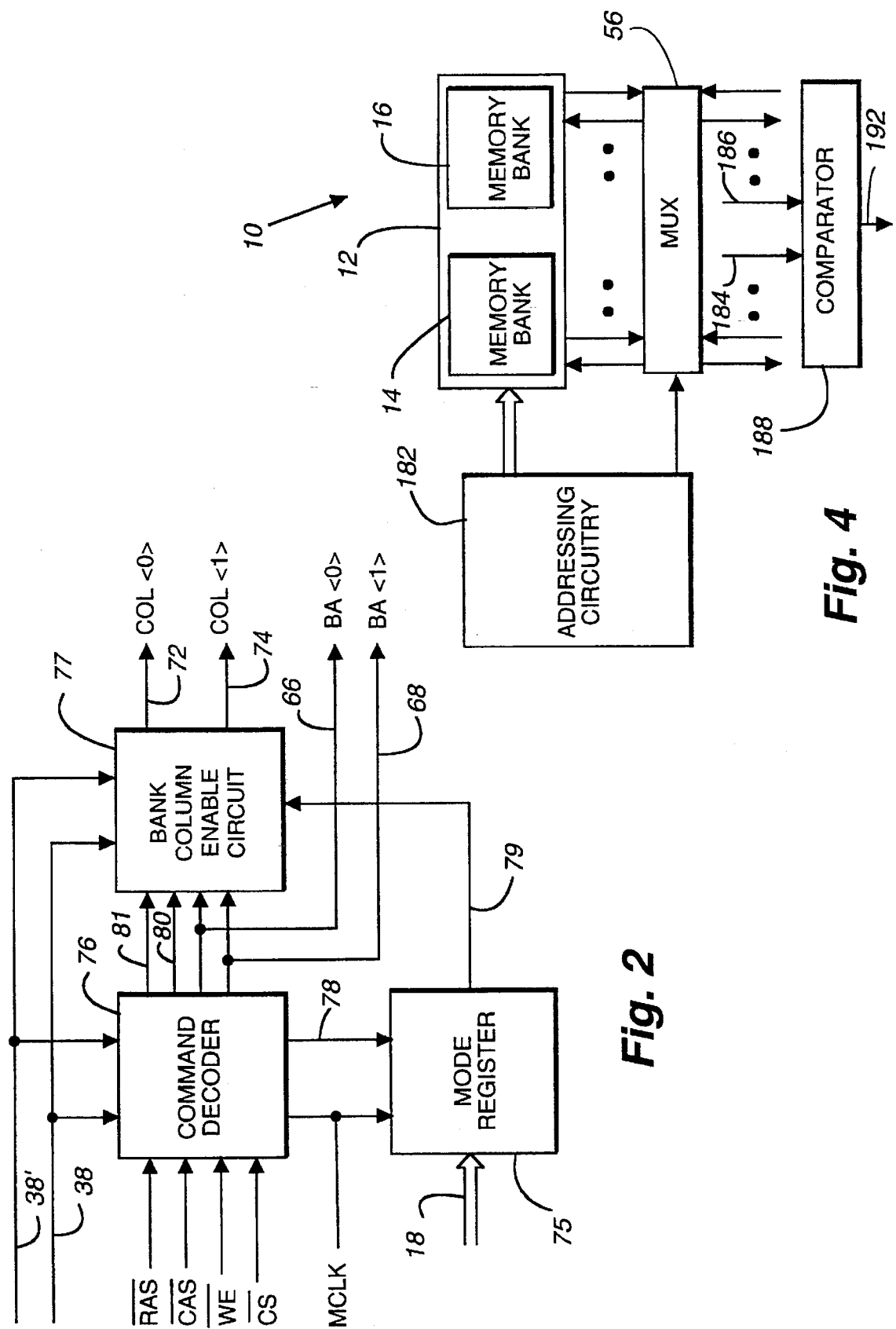
FIG. 2 is a functional block diagram illustrating in greater detail the bank logic circuitry which forms a portion of the memory device shown in FIG. 1.

FIG. 2 illustrates the bank logic circuitry 36 in greater detail. The bank logic circuitry 36 is here shown to include a mode register 75, a command decoder 76, and a memory bank column enabling circuitry 77. The mode register 75 and the command decoder 76 together form a command signal receiving circuit as the register 75 is coupled to receive to address select signals generated on the address select lines 18 and the decoder is coupled to receive the signals generated on the lines 38, 38', and 58, 59, 60, 62, 64 described previously. The enabling circuit 77 is additionally coupled to the lines 38 and 38'.

The command decoder 76 generates a MRS (mode register set) signal on the line 78 responsive to times in which the signals applied thereto are of selected values and applied in a selected sequence. The line 78 is coupled to the register 75 and the mode register 75 is operative to generate a multi-bank addressing mode, or test mode, signal on the line 79 for application to the enabling circuit 77.

The command decoder is further operative, responsive to the signals applied thereto, to generate the BA<0> and BA<1> signals on the lines 66 and 68, to generate a column address enable, CAE, signal on line 80, and a reset signal on line 81. The lines 66, 68, 80, and 81 are coupled to the enabling circuit 77 and the enabling circuit is operative to selectively generate the col<0> and col<1> signals on the lines 72 and 74.

During normal addressing operations, a column of memory cells of either the first memory bank 14 or the second memory bank 16 is addressed. Data is read from or written to a memory cell located in a column of either the first memory bank 14 or the second memory bank 16, depending on whether a signal is generated on line 72 or 74, respectively. When, however, the memory array 12 is tested, such as during a period preceding the release of the memory device 10 to an end user, signals are generated on both of the lines 72 and 74 to cause the column decoder circuitry 52 to generate signals on line 54 to cause columns from both of the memory banks 14 and 16 to be addressed concurrently.

When memory cells in columns of both of the memory banks 14 and 16 are addressed, data can be written to, or read from, memory cells located in the columns of both of the memory banks 14 and 16.

Typically, during testing of the memory device 10, data of a known value is written to the memory cells of the memory array 12. Conventionally, data is written to the memory cells of the first memory bank 14 and then the second memory bank 16 or otherwise written to the memory banks 14 and 16 in a serial manner. As the storage capacities of memory devices has increased, the time period required to write data to the memory cells of the memory device has increased. When large numbers of memory devices must be tested, a significant time period must be allocated to the writing of data to the memory cells of the memory devices. By decreasing the time period required to write data to the memory cells of the memory devices, an increased throughput of memory devices undergoing testing is possible.

The bank logic circuitry 36 is operative to generate signals on both the lines 72 and 74 to permit the concurrent addressing of columns of the memory banks 14 and 16 when signals generated on the lines 58, 59, 60, 62, 64 are of selected values and certain of the signals are applied to the circuitry 36 in a selected sequence. The JEDEC standards define certain signal protocols and permit user-defined signals to be created. The user-defined signals together with the other JEDEC-standard signals, when applied to the circuitry 36, cause generation of the signals on both of the lines 72 and 74.

When signals are generated on the lines 58, 59, 60, 62, 64 in manners described above, the bank logic circuitry 36 generates signals on both of the lines 72 and 74 and columns of both of the memory banks 14 and 16 are addressed. Data is thereafter written to, or read from, memory cells of both of the memory banks 14 and 16. If only one of the memory banks 14 or 16 is open, the bank logic circuitry 36 generates a signal on line 72 or 74 corresponding to the open memory bank. Times in which neither memory bank 14 nor memory bank 16 is open, the bank logic circuitry 36 does not generate signals on either lines 72 or 74, and no columns of either of the memory banks 14 or 16 are addressed.

When signals are generated on both lines 72 and 74, by merely generating an incrementing signal on the lines $A_0$–$A_7$ which increments through all of the possible values of the signals on such lines, all of the memory cells of both banks 14 and 16 are addressed.

Figure 3:
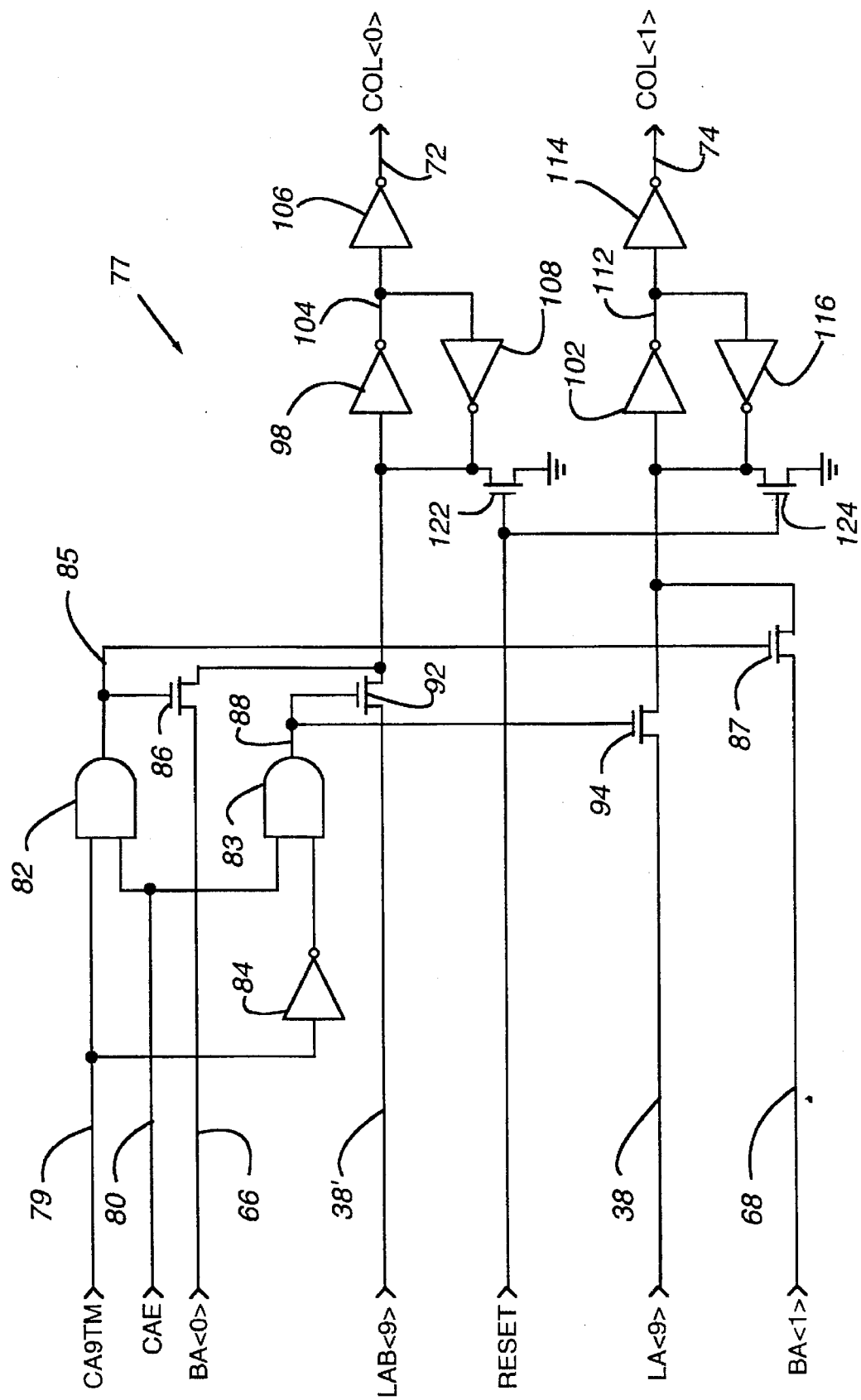
FIG. 3 is a circuit diagram illustrating the memory bank column enabling circuitry of the bank logic circuitry shown in FIG. 1 of an embodiment of the present invention.

FIG. 3 illustrates the memory bank column enabling circuit 77 of the bank logic circuitry 36 of an embodiment of the present invention. The enabling circuit 77 illustrated in the figure is represented by logical gating circuitry and conventional switch circuitry. The enabling circuit 77 may, of course, be implemented in other manners, such as by other combinations of logic gates and other types of switching circuitry.

The enabling circuit 77 illustrated in FIG. 3 is coupled to receive, on lines 38 and 38', signals representative of the most significant bit, here the ninth bit, of the address select signals. The signals applied on lines 38 and 38' are buffered and latched by the address buffers 22 shown in FIG. 1. The signals are again designated in FIG. 3 by the acronyms LA<9> and LAB<9.

The multi-bank addressing mode signal, designated by CA9TM, is also applied to the enabling circuit on line 79. Further inputs to the enabling circuit 77 include the BA<0> and BA<1> signals generated on lines 66 and 68. As described previously, the signals generated on lines 66 and 68 indicate times in which the first and second memory banks, respectively, are open, or addressable. The signal generated on the line 66 is designated in the figure by BA<0>, and the signal generated on the line 68 is designated in the figure by BA<1>. The column address enable signal is also applied to the enabling circuit on line 80, and the reset signal is applied to the circuit 77 on line 81.

Line 79 is coupled to an input of a first AND gate 82 and to an input of a second AND gate 83 by way of an inverter 84. Line 80 is coupled to an input of the gates 82 and 83.

An output line 85 of the first AND gate 82 is coupled to a gate electrode of a transistor switch 86 and to a transistor switch 87. When the first AND gate 82 generates a signal upon the output line 85, the signal biases the gate electrodes of the transistors 86 and 87 to turn the transistors on.

Analogously, an output line 88 extending from an output of a second AND gate 83 is coupled to a gate electrode of a transistor 92 and to a gate electrode of a transistor 94. When a signal is generated by the second AND gate 83 on the output line 88, the transistors 92 and 94 are biased, and the transistors are turned-on to form short circuits when the signal is generated on the line 88.

Because both of the AND gates 82 and 83 receive the CAE signal on line 80 and receive the CA9TM or the inverse of the CA9TM signal, signals will not be generated on both of the output lines 85 and 88 simultaneously. When the CAE signal is generated, an output signal is generated on either the output line 85 or the output line 88, dependent upon the CA9TM signal.

Source and drain electrodes of the transistor 86 are connected between the line 66 and an input of an isolating inverter 98. And, the source and drain electrodes of the transistor 92 are coupled between the line 38' and the input to the inverter 98. Because signals are applied only in the alternative to the lines 85 and 88, the lines 38' and 66 are coupled through the transistors 86 or 92 to the inverter 98 only in the alternative.

When the CA9TM signal is generated, the first AND gate 82 generates a signal on the output line 85, the transistor 86 is turned on, and the value of the BA<0> signal is applied to an input of the inverter 98. When, conversely, the CA9TM signal is not generated (i.e., is of a low value), the second AND gate 83 generates an output signal on the line 88, the transistor 92 is turned-on, and the value of the LAB<9> signal is applied to the inverter 98.

In analogous fashion, the source and drain electrodes of the transistor 87 are connected between the line 68 and an isolating inverter 102, and the source and drain electrodes of the transistor 94 are coupled between the line 38 and the input of the inverter 102. When the CA9TM signal is generated, the first AND gate 82 generates an output signal on the output line 85, the transistor 87 turns on, and the BA<1> signal is applied to the inverter 102. And, when the CA9TM signal is not generated (i.e., the signal is of a low value), the second AND gate 83 generates an output signal on the line 88, the transistor 94 turns on, and the LA<9> is applied to the input of the inverter 102.

An output line 104 extends between an output of the inverter 98 and an input of an inverter 106 and also to an input of an inverter 108. Similarly, an output line 112 extends between an output of the inverter 102 and an input of an inverter 114 and also to an input of an inverter 116. Inverters 108 and 116 serve to latch the inputs to inverters 98 and 102 so that even when control signals 85 and 88 are no longer valid, the data transferred to 98 and 102 input remains.

The output line 72 is coupled to an output terminal of the inverter 106, and the output line 74 is coupled to an output terminal of the inverter 114.

The signal generated upon the output line 72 is of a value corresponding to the value of the BA<0> when the CAE and CA9TM signals are generated. When the CAE signal is generated, but the CA9TM signal is not generated, the signal generated upon the output line 72 is of a value corresponding to the value of the LAB<9>. Similarly, when the CAE and CA9TM signals are generated, the signal generated upon the output line 74 is of a value corresponding to the value of the BA<1> signal. When the CAE signal is generated, but the CA9TM signal is not generated, the signal generated upon the output line 74 is of a value corresponding to the value of the LA<9> signal.

Source and drain electrodes of a transistor 122 are coupled between the input to the inverter 98 and the output of the inverter 108 commonly-connected thereto and ground. Similarly, source and drain electrodes of a transistor 124 are coupled between an input terminal of the inverter 102 and an output terminal of the inverter 116 coupled thereto and a ground connection. The gate electrodes of the transistor 122 and 124 are coupled to receive a reset signal, designated in the figure by RESET. When the reset signal is generated, the transistors 122 and 124 are turned on, and the inputs to the inverters 98 and 102 are shunted to ground.

A memory device 10 incorporating the bank logic circuitry 36 permits data to be written concurrently to more than one memory bank, such as the memory banks 14 and 16. During testing of the memory device, data can be written to the memory banks of a memory array in a reduced period of time as the data can be written concurrently to more than one memory bank. The bank logic circuitry 36 may further be operative to enable writing of data to more than one memory bank concurrently when, for instance, identical data is to be stored in the memory banks of a memory array, such as when the contents of the memory array are to generate a back display having a common pattern.

When columns of more than one memory bank are addressed, data can also be read concurrently from memory cells located in the multiple numbers of memory banks.

FIG. 4 illustrates the memory device 10 of another embodiment of the present invention. The memory device again includes a memory array 12 having memory banks 14 and 16, addressing circuitry, here shown generally at 182, and a multiplexor 56. Data read from the memory banks 14 and 16 accessed responsive to enabling of columns of memory cells of both of the memory banks 14 and 16, are generated on lines 184 and 186. The lines 184 and 186 are coupled to comparator circuitry 188 whereat comparisons of the values of the signals generated on the lines 184 and 186 may be made. Signals representative of comparisons between the values of the signals are generated on the line 192.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. In a synchronous dynamic random access memory device, having a multi-bank memory array and addressing circuitry for individually addressing a row and a column of memory banks of the multi-bank memory array, a combination with the addressing circuitry of a test enabling circuit for enabling concurrent addressing of at least two columns of memory cells of at least two of the memory banks, said test enabling circuit comprising:

multi-bank addressing mode signal circuitry coupled to receive a multi-bank addressing mode signal and a column address enable signal, said multi-bank addressing mode signal circuitry for generating multi-bank address select signals when the multi-bank addressing mode signal and the column address enable signal are concurrently received thereat; and column address select signal generating circuitry coupled to receive the multi-bank address select signals generated by said multi-bank addressing mode signal circuitry, said column address select signal generating circuitry for generating column address select signals enabling the concurrent addressing and testing of the memory cells of the at least two columns of the at least two memory banks when the multi-bank address select signals are generated.

2. A bank logic circuit for testing a memory device having a multi-bank memory array formed of rows and columns of memory cells, the memory cells forming at least a first memory bank of memory cells and a second memory bank of memory cells, said bank logic circuit comprising:

command signal receiving circuitry coupled to receive indications of a test request to concurrently address columns of memory cells of the first memory bank and columns of memory cells of the second memory bank; and bank column enabling circuitry coupled to said command signal receiving circuitry, said bank column enabling circuitry for generating column address select signals enabling concurrent addressing and testing of said columns of memory cells of the first memory bank and said columns of memory cells of the second memory bank responsive to times in which said command signal receiving circuitry receives the indications of the request to concurrently address the columns of the memory cells of the first and second memory banks, respectively.

3. The bank logic circuit of claim 2 wherein said bank column enabling circuitry comprises multi-bank addressing mode signal circuitry coupled to receive a multi-bank addressing mode signal and a column address enable signal, said multi-bank addressing mode signal circuitry for generating multi-bank address select signals when the multi-bank addressing mode signal and the column address enable signal are received simultaneously thereat.

4. The bank logic circuit of claim 3 wherein said bank column enabling circuitry further comprises column address select signal generating circuitry coupled to receive the multi-bank address select signals generated by said multi-bank addressing mode signal circuitry, said column address select signal generating circuitry for generating column address select signals enabling the concurrent addressing and testing of the memory cells of the at least two of the memory banks when the multi-bank address select signals are generated.

5. A method for testing the memory cells that are within the memory banks of a multi-bank memory array by selectively and concurrently addressing a plurality of columns of the memory cells of the memory banks of the multi-bank memory array of a memory device, said method comprising the steps of:

applying a multi-bank addressing mode signal to the memory device;

during said step of applying, generating column address select signals, to enable addressing of selected columns of selected memory banks of the multi-bank memory array; and concurrently addressing and testing memory cells located in the selected columns of the memory banks selected by the column address select signal generated during said step of generating.

6. The method of claim 5 wherein the multi-bank memory array includes a first memory bank and a second memory bank and wherein said step of generating the column address select signals comprises generating a first memory bank column address select signal for selectively addressing of a column of the first memory bank and generating a second memory bank column address select signal for selectively addressing of a column of the second memory bank.

7. The method of claim 6 wherein said step of addressing includes the step of incrementally addressing pairs of memory cells formed of a memory cell of the first memory bank and a memory cell of the second memory bank.

8. The method of claim 7 wherein said step of incrementally addressing includes the step of incrementally addressing every unique pair of memory cells of the multi-bank memory array of the memory device.

9. The method of claim 8 wherein said step of incrementally addressing includes the step of applying address select signals of incrementing values to the memory device.

10. The method of claim 5 wherein the memory device includes addressing circuitry and wherein said step of applying the multi-bank addressing signal comprises applying the multi-bank addressing signal to the addressing circuitry.

11. The method of claim 10 further including the step of applying address select signals to the addressing circuitry.

12. The method of claim 11 including the further steps of buffering and latching the address select signals applied to the addressing circuitry.

13. The method of claim 5 including the further step of determining which memory banks of the multi-bank memory array are addressable.

14. The method of claim 13 including the further step of generating bank active signals indicative of which of the memory banks of the multi-bank memory array are addressable.

15. The method of claim 14 wherein the multi-bank memory array includes a first memory bank and a second memory bank and wherein said step of generating the bank active signals includes the steps of generating a first memory bank active signal when the first memory bank is addressable and generating a second memory bank active signal when the second memory bank is addressable.

16. The method of claim 5 further comprising the step of writing data to memory cells located in the columns addressed during said step of addressing.

17. The method of claim 5 further comprising the step of reading data from the memory cells located in the columns addressed during said step of addressing.

18. The method of claim 17 further comprising the step of comparing values of the data read from the memory cells located in the columns addressed during said step of addressing.

19. The method of claim 5 wherein the memory device comprises a synchronous dynamic random access memory and wherein said step of applying comprises applying the multi-bank addressing mode signal to the synchronous dynamic random access memory.

* * * * *